United States Patent
Shimizu et al.

(10) Patent No.: US 12,262,495 B2
(45) Date of Patent: Mar. 25, 2025

(54) ELECTRICAL CONNECTION BOX

(71) Applicant: YAZAKI CORPORATION, Tokyo (JP)

(72) Inventors: Isanori Shimizu, Makinohara (JP); Arata Yagi, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 15 days.

(21) Appl. No.: 18/522,246

(22) Filed: Nov. 29, 2023

(65) Prior Publication Data

US 2024/0196552 A1  Jun. 13, 2024

(30) Foreign Application Priority Data

Dec. 7, 2022  (JP) .................. 2022-195414

(51) Int. Cl.
*B60R 16/023* (2006.01)
*H05K 5/02* (2006.01)

(52) U.S. Cl.
CPC ....... *H05K 5/0247* (2013.01); *B60R 16/0239* (2013.01); *B60R 16/0238* (2013.01)

(58) Field of Classification Search
CPC ................................................ B60R 16/0239
See application file for complete search history.

(56) References Cited

U.S. PATENT DOCUMENTS

| 8,946,565 | B2 | 2/2015 | Hattori et al. | |
| 9,979,170 | B1 * | 5/2018 | Nakano | H01B 7/0045 |
| 10,442,314 | B2 | 10/2019 | Yoshihara et al. | |
| 2012/0052748 | A1 * | 3/2012 | Sato | H05K 7/026 439/701 |
| 2016/0315458 | A1 * | 10/2016 | Kamo | B60R 16/0238 |
| 2019/0132966 | A1 * | 5/2019 | Mitsui | H05K 3/202 |
| 2021/0210301 | A1 * | 7/2021 | Tashiro | H01R 13/696 |
| 2024/0322539 | A1 * | 9/2024 | Kurizono | B60R 16/0239 |

FOREIGN PATENT DOCUMENTS

| JP | 2014-3854 A | 1/2014 |
| JP | 2019-51876 A | 4/2019 |

\* cited by examiner

*Primary Examiner* — Hung V Ngo
(74) *Attorney, Agent, or Firm* — KENEALY VAIDYA LLP

(57) ABSTRACT

An electrical connection box includes an auxiliary housing of a tubular shape interposed between a first housing and a second housing in a state where a second terminal is in complete contact with a first terminal. The auxiliary housing includes a holding portion that positions and holds the first terminal with respect to the first housing and a guide portion that guides the second terminal toward the first terminal in a state where the auxiliary housing is disposed on an opening side of the first housing.

6 Claims, 3 Drawing Sheets

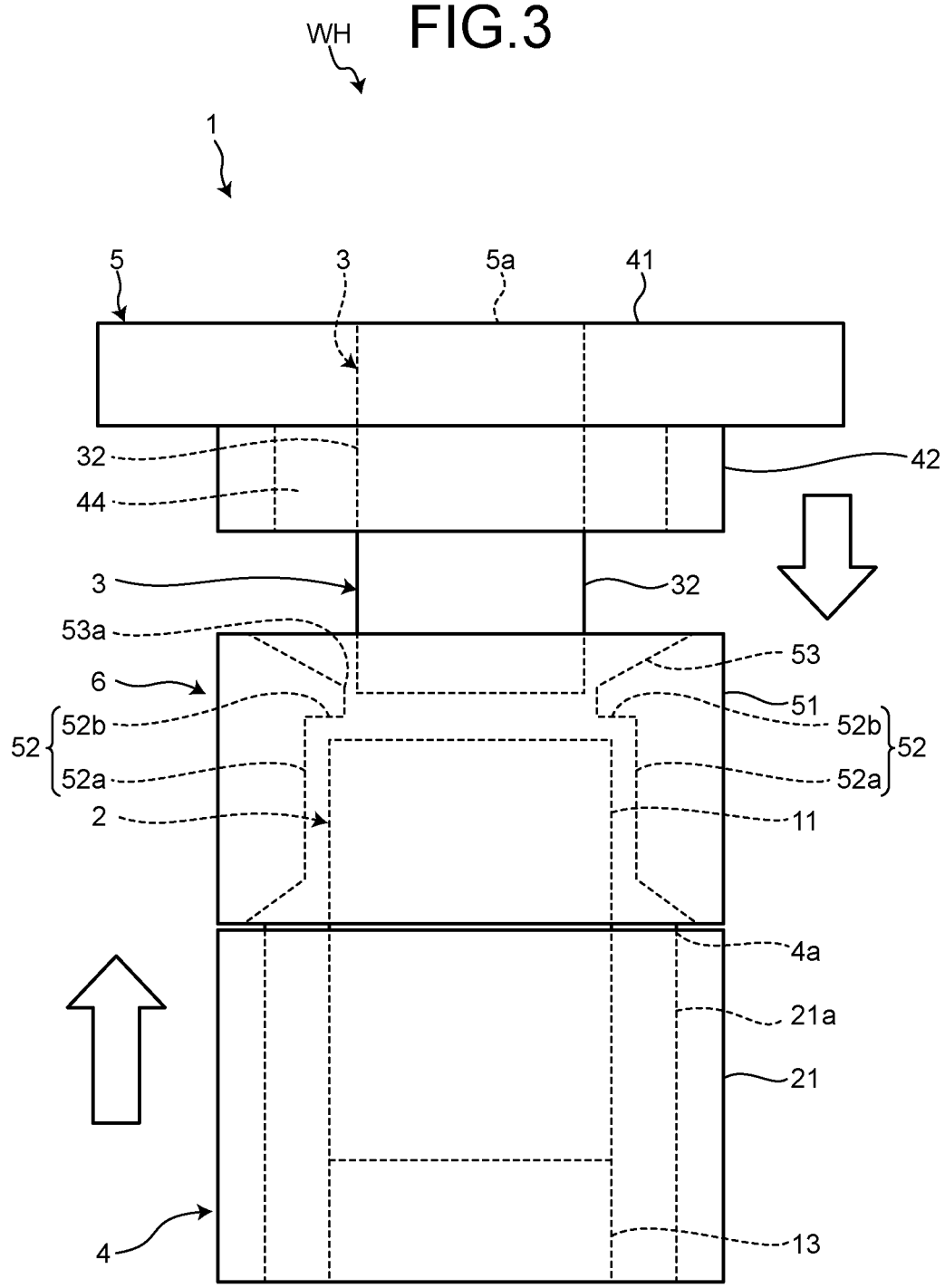

ELECTRICAL CONNECTION BOX

CROSS-REFERENCE TO RELATED APPLICATION(S)

The present application claims priority to and incorporates by reference the entire contents of Japanese Patent Application No. 2022-195414 filed in Japan on Dec. 7, 2022.

BACKGROUND OF THE INVENTION

1. Field of the Invention

The present invention relates to an electrical connection box.

2. Description of the Related Art

In the related art, there are electrical connection boxes which are mounted on a vehicle and connected to a control circuit such as a motor of the vehicle. For example, Japanese Patent Application Laid-open No. 2019-51876 describes an electrical connection box structured in such a manner that, when a terminal portion of an electronic component is inserted into a block from another side in a first direction, an end portion on the other side in the first direction of a cavity picks up the terminal portion. Furthermore, Japanese Patent Application Laid-open No. 2014-3854 describes an electrical connection box structured in such a manner that a connector housing is provided with second side support ribs and that a connecting portion of a connection terminal is sandwiched between the pair of side support ribs from both sides in a width direction.

In the electrical connection boxes of the related art, there is interference with a male terminal due to rattling of a female terminal at the time of assembling the electrical connection box, and thus there is room for improvement in assembling workability.

SUMMARY OF THE INVENTION

An object of the present invention is to provide an electrical connection box capable of improving workability at the time of assembly.

In order to achieve the above mentioned object, an electrical connection box according to one aspect of the present invention includes a first housing formed in a tubular shape, the first housing housing, from one opening, a first terminal having conductivity; a lid-like second housing that holds a second terminal being in contact with and electrically connected to the first terminal, the second housing covering the opening; and a tubular auxiliary housing interposed between the first housing and the second housing in a state where the second terminal is in complete contact with the first terminal, wherein the auxiliary housing includes: a holding portion that positions and holds the first terminal with respect to the first housing in a state where the auxiliary housing is disposed on the opening side of the first housing; and a guide portion that guides the second terminal toward the first terminal.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 3 is a schematic view illustrating the main part of the electrical connection box illustrated in FIG. 1.

DETAILED DESCRIPTION OF THE PREFERRED EMBODIMENTS

Hereinafter, embodiments of an electrical connection box according to the present invention will be described in detail with reference to the drawings. Note that the invention is not limited by the embodiments. That is, components in the following embodiments include those that can be easily perceived by those skilled in the art or those that are substantially the same, and various omissions, substitutions, and modifications can be made without departing from the gist of the invention.

Embodiments

Figure 1:
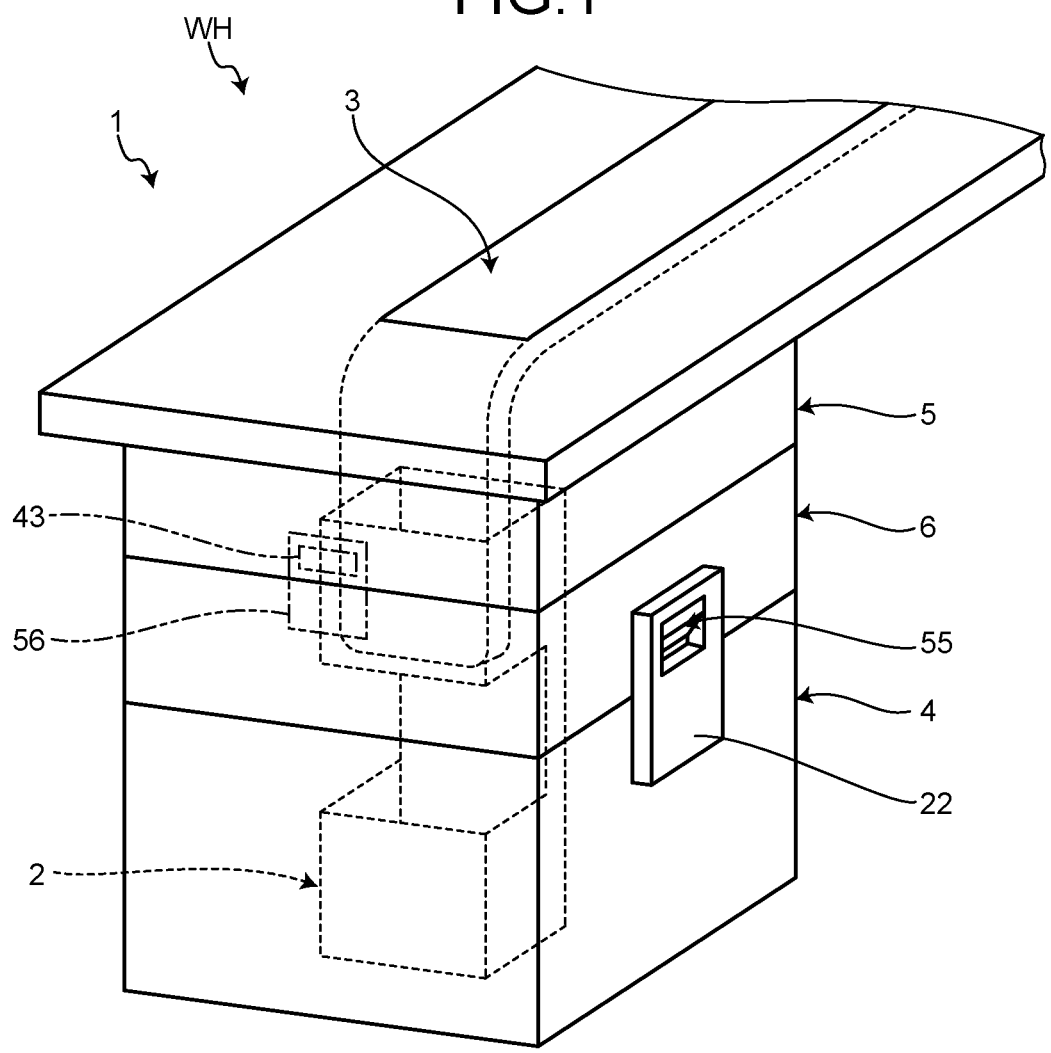
FIG. 1 is a perspective view illustrating an electrical connection box according to an embodiment.
Figure 1:
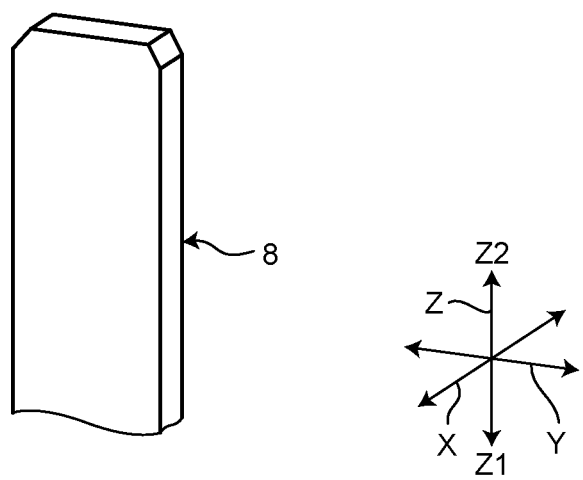
Figure 2:
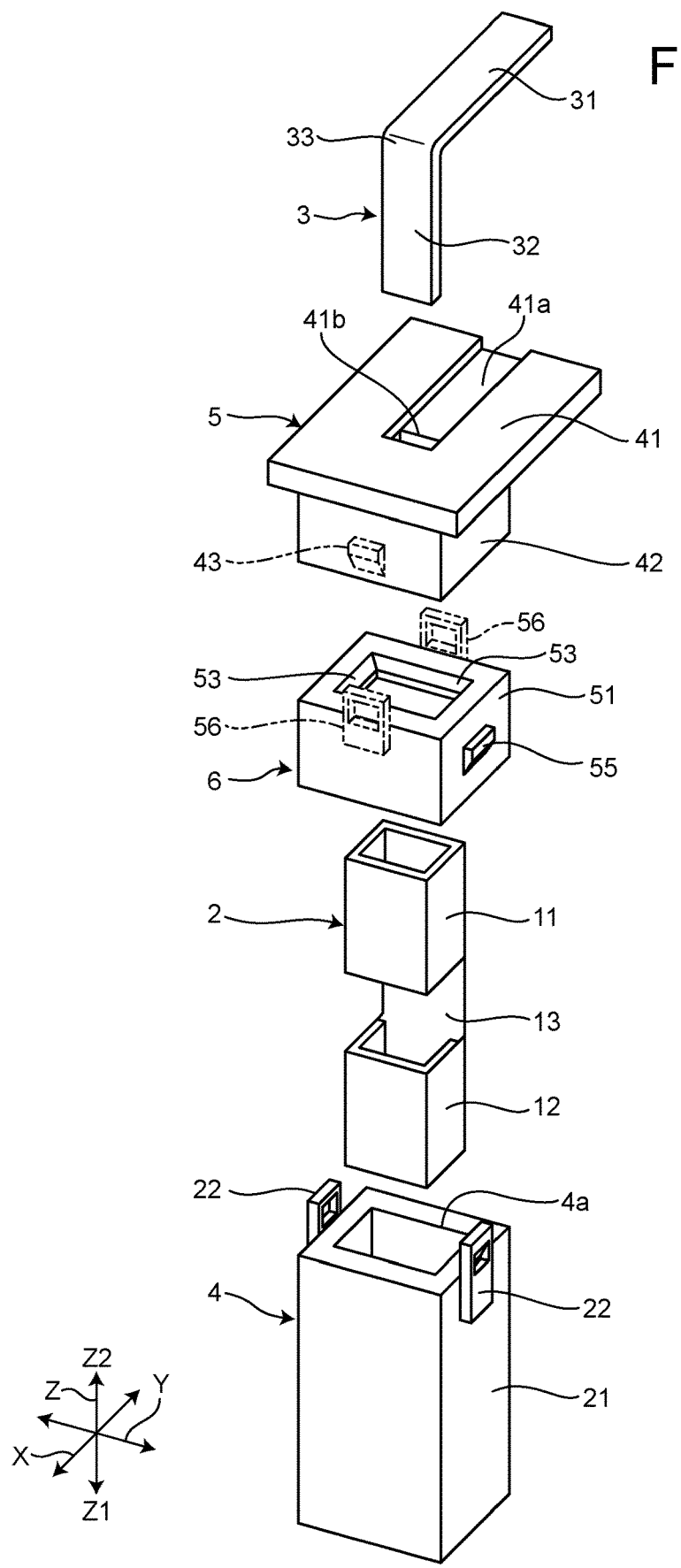
FIG. 2 is an exploded perspective view illustrating a schematic configuration of the electrical connection box illustrated in FIG. 1.

An electrical connection box 1 according to the present embodiment illustrated in FIGS. 1, 2, and 3 is mounted on a vehicle such as an automobile and is interposed between a control circuit (not illustrated) and a motor (not illustrated) to electrically connect the control circuit and the motor to each other. The electrical connection box 1 is incorporated in, for example, a wire harness WH. The wire harness WH is, for example, structured in such a manner that a plurality of wiring members W used for power supply or signal communication is bundled to form a collective component for connection between devices mounted on a vehicle and that the plurality of wiring members W is connected to each device by a connector or the like.

The electrical connection box 1 of the present embodiment includes a first terminal 2, a second terminal 3, a first housing 4, a second housing 5, and an auxiliary housing 6.

Note that, in the following description, an "X" direction illustrated in FIGS. 1 to 3 corresponds to one of width directions of the electrical connection box 1 and is referred to as a "first width direction X". A "Y" direction corresponds to the other width direction of the electrical connection box 1 and is referred to as a "second width direction Y". A "Z" direction corresponds to an insertion and removal direction of the second terminal 3 with respect to the first terminal 2 and is referred to as an "insertion and removal direction Z". The first width direction X, the second width direction Y, and the insertion and removal direction Z are orthogonal to each other. In FIGS. 1 and 2, a locking projection 43 and a locked portion 56 to be described later are each indicated by a two-dot chain line, and in FIG. 3, a pair of locking projections 43 and locked portions 56 and a pair of locking projections 55 and locked portions 22 are each omitted.

The first terminal 2 is, for example, a metal terminal formed of a flat plate-like metal material having conductivity and is a so-called female terminal. The first terminal 2 is interposed between the second terminal 3 and a motor terminal 8 illustrated in FIG. 1 in a state of being housed in the first housing 4 and electrically connects the second terminal 3 and the motor terminal 8. The first terminal 2 is formed in such a manner that the second terminal 3 and the motor terminal 8 can be inserted and removed in correspondence with the shapes of the second terminal 3 and the motor terminal 8. The first terminal 2 has a shape in which two tubular portions are connected along the insertion and removal direction Z. The first terminal 2 includes a first tubular portion 11, a second tubular portion 12, and a connecting portion 13. The first tubular portion 11, the second tubular portion 12, and the connecting portion 13 are integrally molded.

The first tubular portion 11 is formed in a tubular shape in which both ends of the first terminal 2 in the insertion and removal direction Z are opened and is a portion in which the second terminal 3 is inserted inward from a removal direction Z2 to an insertion direction Z1 to be in contact therewith. The first tubular portion 11 is formed to have a rectangular cross-sectional shape as viewed in the insertion and removal direction Z. A conducting portion (not illustrated) is included on an inner side of the first tubular portion 11, and with the second terminal 3 inserted into the first tubular portion 11, the conducting portion and the second terminal 3 come into contact with each other, and the first terminal 2 and the second terminal 3 are conductively connected to each other.

Similarly to the first tubular portion 11, the second tubular portion 12 is formed in a tubular shape in which both ends in the insertion and removal direction Z are opened and is a portion into which the motor terminal 8 illustrated in FIG. 1 is inserted inward from the insertion direction Z1 to the removal direction Z2 to be in contact therewith. The second tubular portion 12 is formed to have a rectangular cross-sectional shape as viewed in the insertion and removal direction Z. A conducting portion (not illustrated) different from the conducting portion of the first tubular portion 11 is included on an inner side of the second tubular portion 12, and with the motor terminal 8 inserted into the second tubular portion 12, the conducting portion and the motor terminal 8 come into contact with each other, and the first terminal 2 and the motor terminal 8 are conductively connected to each other.

The connecting portion 13 is a portion formed in a flat plate shape and connects the first tubular portion 11 and the second tubular portion 12 in the insertion and removal direction Z. The connecting portion 13 is integrally molded with the first tubular portion 11 and the second tubular portion 12.

The second terminal 3 is, for example, a metal terminal formed of a flat plate-like metal material having conductivity and is a so-called male terminal. The second terminal 3 is interposed between the control circuit and the first terminal 2 in a state of being held by the second housing 5 and electrically connects the control circuit and the first terminal 2. The second terminal 3 is formed to have an L-shaped cross section as viewed in the second width direction Y. The second terminal 3 includes a held portion 31, a connecting portion 32, and a bent portion 33. The held portion 31, the connecting portion 32, and the bent portion 33 are integrally molded.

The held portion 31 is a portion formed to extend in the first width direction X in the second terminal 3 and has one end portion in the first width direction X connected to the connecting portion 32 via the bent portion 33 and the other end portion connected to the control circuit side. The held portion 31 is accommodated and held in a terminal accommodation groove 41a included in the second housing 5 described later.

The connecting portion 32 is a portion formed to extend in the insertion and removal direction Z in the second terminal 3 and is inserted and held in an opening 41b included in the second housing 5 described later.

The first housing 4 is formed in a tubular shape having both ends in the insertion and removal direction Z opened and houses the first terminal 2 from one opening 4a. The first housing 4 is formed of an insulating resin material or the like. The first housing 4 is formed to have a rectangular cross-sectional shape as viewed in the insertion and removal direction Z. The opening 4a is included on the removal direction Z2 side, which is one side of the insertion and removal direction Z and is formed to have a rectangular shape as viewed from the removal direction Z2 side. The first housing 4 is formed in such a manner that an end portion of the first terminal 2 on the removal direction Z2 side protrudes from the opening 4a toward the removal direction Z2 side in a housed state in which the first terminal 2 is housed inside. The first housing 4 includes a main body 21 and a pair of locked portions 22. The main body 21 and the pair of locked portions 22 are integrally molded.

The main body 21 is a portion that houses the first terminal 2 inserted from the opening 4a in the insertion direction Z1 in the first housing 4. The main body 21 includes, for example, a pair of peripheral walls facing each other in the first width direction X and a pair of peripheral walls facing each other in the second width direction Y.

The locked portions 22 are provided on respective outer surfaces of the pair of wall portions facing each other in the second width direction Y in the first housing 4 and are locked to the locking projections 55 provided to the auxiliary housing 6 described later, thereby connecting the first housing 4 and the auxiliary housing 6 in the insertion and removal direction Z.

The second housing 5 is a lid-like member that holds the second terminal 3 and covers the opening 4a side of the first housing 4. The second housing 5 is formed of an insulating resin material or the like. The second housing 5 includes an upper wall portion 41, a main body 42, and locking projections 43. The upper wall portion 41, the main body 42, and the locking projections 43 are integrally molded.

The upper wall portion 41 is a wall portion that is formed at an end portion of the main body 42 on the removal direction Z2 side in the second housing 5 and holds the second terminal 3 inserted from the opening 41b in the insertion direction Z1. The opening 41b is located at a bottom surface of the terminal accommodation groove 41a and is formed to penetrate the upper wall portion 41 in the plate thickness direction (insertion and removal direction Z). The connecting portion 32 of the second terminal 3 is inserted into the opening 41b from the removal direction Z2 side to the insertion direction Z1. The terminal accommodation groove 41a accommodates the held portion 31 in a state where the second terminal 3 is held by the second housing 5. In the upper wall portion 41, both ends in the first width direction X and both ends in the second width direction Y protrude outward from the main body 42.

The main body 42 is a portion interposed between the upper wall portion 41 and the first housing 4 while housing a part of the second terminal 3 in a state where the second housing 5 covers the opening 4a side of the first housing 4. The main body 42 includes, for example, a pair of peripheral walls facing each other in the first width direction X, a pair of peripheral walls facing each other in the second width direction Y, and an internal space 44 (see FIG. 3) formed by these four peripheral walls. In the internal space 44, the connecting portion 32 of the second terminal 3 is inserted in the insertion and removal direction Z in a state where the second terminal 3 is held by the second housing 5. In the second terminal 3, an end portion of the second terminal 3 on the insertion direction Z1 side protrudes outward from the internal space 44 in a state where the second terminal 3 is held by the second housing 5.

The locking projections 43 are provided on respective outer surfaces of the pair of wall portions facing each other in the second width direction Y, and the locked portions 56 included in the auxiliary housing 6 described later are locked thereto, thereby connecting the second housing 5 and the auxiliary housing 6 in the insertion and removal direction Z.

The auxiliary housing 6 is a tubular member interposed between the first housing 4 and the second housing 5 in a state where the second terminal 3 is in complete contact with the first terminal 2. The auxiliary housing 6 is formed in a rectangular shape as viewed in the insertion and removal direction Z. The auxiliary housing 6 includes a main body 51, a holding portion 52, a guide portion 53, the pair of locking projections 55, and the pair of locked portions 56.

The main body 51 is a portion interposed between the first housing 4 and the second housing 5 in a state where the second terminal 3 is in complete contact with the first terminal 2 and houses a part of the connecting portion 32 and a part of the first tubular portion 11.

The holding portion 52 positions and holds the first terminal 2 with respect to the first housing 4 in a state where the auxiliary housing 6 is disposed on the opening 4a side of the first housing 4. As illustrated in FIG. 3, the holding portion 52 has a first facing surface 52a and a second facing surface 52b.

The first facing surface 52a is included in an inner peripheral surface of the auxiliary housing 6 and includes surfaces facing each other in the first width direction X and surfaces facing each other in the second width direction Y. The first facing surface 52a faces the first tubular portion 11 of the first terminal 2 housed in the first housing 4 in directions intersecting the insertion and removal direction Z in a state where the auxiliary housing 6 is disposed on the opening 4a side of the first housing 4 and regulates the movement of the first terminal 2 in the directions intersecting the insertion and removal direction Z of the first terminal 2. As illustrated in FIG. 3, for example, when viewed from the first width direction X and the second width direction Y, the first facing surface 52a is located on an inner side with respect to an inner peripheral surface 21a of the main body 21.

The second facing surface 52b is included in the inner peripheral surface of the auxiliary housing 6 and is constituted by surfaces intersecting with the first facing surface 52a. The second facing surface 52b faces the first tubular portion 11 of the first terminal 2 housed in the first housing 4 in the insertion and removal direction Z in a state where the auxiliary housing 6 is disposed on the opening 4a side of the first housing 4 and regulates the movement of the first terminal 2 in the removal direction Z2 of the first terminal 2. The first facing surface 52a and the second facing surface 52b are included in the inner peripheral surface of the auxiliary housing 6 together with the guide portion 53 described later.

The guide portion 53 guides the second terminal 3 toward the first terminal 2. The guide portion 53 is formed in such a manner that the opening width gradually decreases from the second housing 5 side toward the first housing 4 side of the auxiliary housing 6. In other words, the guide portion 53 is formed in such a manner that the opening width gradually decreases from the removal direction Z2 side toward the insertion direction Z1 side. As illustrated in FIG. 3, an opening end 53a on an inner side of the guide portion 53 has a width in the second width direction Y larger than a width of the connecting portion 32 of the second terminal 3 in the second width direction Y.

The locking projections 55 are provided on respective outer surfaces of a pair of wall portions facing each other in the second width direction Y, and the locked portions 22 of the first housing 4 are locked thereto, thereby connecting the first housing 4 and the auxiliary housing 6 in the insertion and removal direction Z.

The locked portions 56 are provided on respective outer surfaces of a pair of wall portions facing each other in the first width direction X in the auxiliary housing 6 and are locked to the locking projections 43 of the second housing 5, thereby connecting the second housing 5 and the auxiliary housing 6 in the insertion and removal direction Z.

Next, a connection method of connecting the second terminal 3 to the first terminal 2 structured as described above will be described with reference to FIGS. 1 to 3. It is based on the premise that the connection method described below is manually performed, for example, by an assembly worker, however, it is not limited thereto. Incidentally, it is based on the premise that the first terminal 2 is housed in the first housing 4 in advance and that the second terminal 3 is assembled to the second housing 5. It is also based on the premise that the auxiliary housing 6 is assembled to the first housing 4 in advance.

First, the assembly worker disposes the second housing 5 on the removal direction Z2 side with respect to the first housing 4 while gripping both ends in the second width direction Y of the upper wall portion 41 of the second housing 5 and inserts the connecting portion 32 of the second terminal 3 protruding from the insertion direction Z1 side of the first housing 4 toward the opening end 53a of the auxiliary housing 6. At this point, in a case where the end portion on the insertion direction Z1 side of the connecting portion 32 abuts on the guide portion 53, the end portion moves toward the opening end 53a while sliding on the guide portion 53. When the assembly worker pushes the second housing 5 toward the insertion direction Z1 side, the connecting portion 32 of the second terminal 3 is inserted into the first tubular portion 11 of the first terminal 2, and the first terminal 2 and the second terminal 3 come into contact with each other. As a result, the assembly worker can suppress interference with the second terminal 3 due to rattling of the first terminal 2 at the time of assembling the electrical connection box 1, thereby improving workability at the time of assembling.

As described above, the electrical connection box 1 according to the present embodiment includes the auxiliary housing 6 having a tubular shape, the auxiliary housing 6 interposed between the first housing 4 and the second housing 5 in a state where the second terminal 3 is in complete contact with the first terminal 2. The auxiliary housing 6 includes the holding portion 52 that positions and holds the first terminal 2 with respect to the first housing 4 and the guide portion 53 that guides the second terminal 3 toward the first terminal 2 in a state where the auxiliary housing 6 is disposed on the opening 4a side of the first housing 4.

With the above structure, in the electrical connection box 1, in the assembly work of assembling the second housing 5 to the first housing 4 to connect the first terminal 2 and the second terminal 3 to each other, the first terminal 2 is held by the auxiliary housing 6 assembled in advance to the first housing 4, and the second terminal 3 can be guided toward the first terminal 2. As a result, the electrical connection box 1 can improve assembly workability in the assembly work of assembling the second housing 5 to the first housing 4 and connecting the first terminal 2 and the second terminal 3 to each other.

In the electrical connection box 1 according to the present embodiment, the guide portion 53 is formed in such a manner that the opening width gradually decreases from the second housing 5 side toward the first housing 4 side of the auxiliary housing 6. As a result, the electrical connection box 1 can suppress interference between the first terminal 2 and the second terminal 3 in the assembly work of assembling the second housing 5 to the first housing 4 and connecting the first terminal 2 and the second terminal 3 to each other.

Moreover, in the electrical connection box 1 according to the present embodiment, the holding portion 52 regulates the movement of the first terminal 2 in the removal direction Z2 of the second terminal 3 with respect to the first housing 4. As a result, the electrical connection box 1 can prevent the first terminal 2 housed in the first housing 4 from rattling toward the second housing 5.

Furthermore, in the electrical connection box 1 according to the present embodiment, the holding portion 52 regulates the movement of the first terminal 2 in the directions intersecting with the insertion and removal direction Z of the second terminal 3 with respect to the first housing 4. As a result, the electrical connection box 1 can prevent rattling in the directions intersecting with the insertion and removal direction Z of the first terminal 2 housed in the first housing 4.

Note that, in the auxiliary housing 6 illustrated in FIG. 3 in the above embodiment, the first facing surface 52a and an outer peripheral surface of the first tubular portion 11 of the first terminal 2 are not in contact with each other but are spaced from each other; however, the present invention is not limited thereto, and the first facing surface 52a and the outer peripheral surface may be in contact with each other.

In addition, in the auxiliary housing 6 illustrated in FIG. 3 in the above embodiment, the second facing surface 52b and an end portion of the first tubular portion 11 of the first terminal 2 on the removal direction side are not in contact with each other but are spaced from each other; however, it is not limited thereto, and the second facing surface 52b and the end portion may be in contact with each other.

According to an electrical connection box of the present embodiments, there is an effect that workability at the time of assembly can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
    a first housing formed in a tubular shape, the first housing housing, from one opening, a first terminal having conductivity;
    a lid-like second housing that holds a second terminal being in contact with and electrically connected to the first terminal, the second housing covering the opening; and
    a tubular auxiliary housing interposed between the first housing and the second housing in a state where the second terminal is in complete contact with the first terminal, wherein
    the auxiliary housing includes:
    a holding portion that positions and holds the first terminal with respect to the first housing in a state where the auxiliary housing is disposed on the opening side of the first housing; and
    a guide portion that guides the second terminal toward the first terminal.

2. The electrical connection box according to claim 1, wherein
    the guide portion is formed in such a manner that an opening width gradually decreases from an opening on the second housing side toward the first housing side of the auxiliary housing.

3. The electrical connection box according to claim 2, wherein
    the holding portion regulates movement of the first terminal in a removal direction of the second terminal with respect to the first housing.

4. The electrical connection box according to claim 2, wherein
    the holding portion regulates movement of the first terminal in a direction intersecting with an insertion and removal direction of the second terminal with respect to the first housing.

5. The electrical connection box according to claim 1, wherein
    the holding portion regulates movement of the first terminal in a removal direction of the second terminal with respect to the first housing.

6. The electrical connection box according to claim 1, wherein
    the holding portion regulates movement of the first terminal in a direction intersecting with an insertion and removal direction of the second terminal with respect to the first housing.

* * * * *